(12) United States Patent
Jiang et al.

(10) Patent No.: US 11,307,469 B2
(45) Date of Patent: Apr. 19, 2022

(54) ARRAY SUBSTRATE, METHOD FOR MANUFACTURING ARRAY SUBSTRATE, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Tao Jiang, Beijing (CN); Yunhai Wan, Beijing (CN); Binbin Cao, Beijing (CN); Xianghua Ren, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 304 days.

(21) Appl. No.: 15/776,193

(22) PCT Filed: Oct. 20, 2017

(86) PCT No.: PCT/CN2017/106995
§ 371 (c)(1),
(2) Date: May 15, 2018

(87) PCT Pub. No.: WO2018/176810
PCT Pub. Date: Oct. 4, 2018

(65) Prior Publication Data
US 2020/0225546 A1 Jul. 16, 2020

(30) Foreign Application Priority Data
Mar. 29, 2017 (CN) .......................... 201710198640.1

(51) Int. Cl.
*G02F 1/1362* (2006.01)
*G02F 1/1333* (2006.01)
(Continued)

(52) U.S. Cl.
CPC ...... *G02F 1/136286* (2013.01); *G02F 1/1333* (2013.01); *G02F 1/134363* (2013.01);
(Continued)

(58) Field of Classification Search
CPC combination set(s) only.
See application file for complete search history.

(56) References Cited

U.S. PATENT DOCUMENTS

| 2012/0056182 | A1 | 3/2012 | Miyairi et al. |
| 2012/0305947 | A1* | 12/2012 | Lee ................ H01L 27/124 257/88 |
| 2016/0011467 | A1* | 1/2016 | Choi ................ H01L 23/528 257/72 |

FOREIGN PATENT DOCUMENTS

| CN | 101071217 A | 11/2007 |
| CN | 102809855 A | 12/2012 |

(Continued)

OTHER PUBLICATIONS

First Office Action for CN Application No. 201710198640.1, dated Mar. 4, 2019.
(Continued)

*Primary Examiner* — Lauren Nguyen
(74) *Attorney, Agent, or Firm* — Dinsmore & Shohl LLP

(57) ABSTRACT

The present disclosure provides an array substrate and a manufacturing method of the array substrate, a display device. An array substrate comprises: a pixel array, each pixel in the pixel array having a pixel electrode; a transistor array, each transistor in the transistor array having a source electrode; and a connection electrode for electrically con-
(Continued)

necting the pixel electrode to a corresponding source electrode.

10 Claims, 6 Drawing Sheets

(51) Int. Cl.
*H01L 27/12* (2006.01)
*G02F 1/1343* (2006.01)
(52) U.S. Cl.
CPC ...... *G02F 1/136227* (2013.01); *H01L 27/127* (2013.01); *H01L 27/1222* (2013.01); *G02F 1/13625* (2021.01); *G02F 1/133302* (2021.01); *G02F 1/134372* (2021.01); *G02F 2201/121* (2013.01); *G02F 2201/123* (2013.01)

(56) References Cited

FOREIGN PATENT DOCUMENTS

| CN | 104867878 A | 8/2015 |
| CN | 105070684 A | 11/2015 |
| CN | 107017267 A | 8/2017 |

OTHER PUBLICATIONS

International Search Report and Written Opinion for International Appl. No. PCT/CN2017/106995, dated Jan. 24, 2018.

\* cited by examiner

ARRAY SUBSTRATE, METHOD FOR MANUFACTURING ARRAY SUBSTRATE, AND DISPLAY DEVICE

CROSS-REFERENCE TO RELATED APPLICATIONS

This application is a U.S. National Stage under 35 U.S.C. § 371 of International Application No. PCT/CN2017/106995, filed on Oct. 20, 2017, which claims priority to Chinese Patent Application No. 201710198640.1, filed on Mar. 29, 2017. The disclosure of each of these applications is incorporated herein by reference in its entirety.

FIELD

The present disclosure relates to an array substrate and a manufacturing method of the same, a display device.

BACKGROUND

TFT-LCD (thin film transistor liquid crystal display) is a mainstream display method in the current flat panel display market due to its advantages of small size, light weight, low power consumption, suitable for preparing large-size panels, and no radiation. TFT-LCD is mainly composed of a TFT substrate (array substrate) and a CF substrate (color filter substrate), wherein the TFT substrate is composed of a certain number of pixel arrays, and each pixel is controlled by a TFT (thin film transistor) to display an image. A pixel array can be formed by repeated thin film deposition, exposure by a mask, etching, and other processes. The signal lines of the TFT are usually made of metal such Al, Mo, Ni, Cu etc. or an alloy. With the increase in size of the panel, a greater RC delay effect can be observed on the signal line, resulting in a greater impact on the LCD panel. Therefore, how to reduce the RC delay of the signal line is important for improving the quality of the LCD. The resistance of Cu is 80% of that of Al. Using Cu instead of Al for the signal line can greatly reduce the RC delay. In addition, since Cu has a smaller resistance, a thinner metal wire can be used, and a film thickness may be thinner. Therefore, the Cu-related processing can increase the aperture ratio of LCD and significantly reduce the cost. Although there are many advantages of Cu, due to the relatively high activity of Cu, it tends to oxidate by absorbing particles, water vapor and the like, leading to greater difficulty in processing control. In dry etching, improper control of processes can easily lead to corrosion or oxidation of a Cu surface, resulting in poor contact between Cu and other metals, and thereby affecting the display of LCD.

Therefore, the current array substrate still needs to be improved.

DISCLOSURE OF THE INVENTION

In one aspect of the present disclosure, an array substrate is provided. According to an embodiment of the present disclosure, the array substrate comprises: a pixel array, each pixel in the pixel array having a pixel electrode; a transistor array, each transistor in the transistor array having a source electrode; and a connection electrode for electrically connecting the pixel electrode to a corresponding source electrode.

According to an embodiment of the present disclosure, each pixel in the pixel array further comprises: a common electrode electrically connected to common electrodes of other pixels in the pixel array, wherein the connection electrode and the common electrode are disposed in the same layer.

According to an embodiment of the present disclosure, the source electrode and the pixel electrode do not overlap in a direction perpendicular to the substrate.

According to an embodiment of the present disclosure, the transistor in the transistor array further comprises a drain electrode, wherein the material for forming the drain electrode and the source electrode comprises Cu.

According to an embodiment of the present disclosure, the material for forming the connection electrode comprises indium tin oxide.

In another aspect of the present disclosure, a display device is provided. According to an embodiment of the present disclosure, the display device comprises the array substrate of the present disclosure described above. Those skilled in the art can understand that the display device has all the features and advantages of the aforementioned array substrate, which will not be described in detail herein.

In still another aspect of the present disclosure, a method for manufacturing an array substrate is provided. According to an embodiment of the present disclosure, the method comprises: forming a common electrode, a connection electrode and a gate electrode on a substrate; forming a gate insulating layer; forming an fully transparent region active layer; forming a drain electrode and a source electrode, the source electrode being electrically connected to the connection electrode; forming a pixel electrode, the pixel electrode being electrically connected to the connection electrode and being electrically connected to the source electrode via the connection electrode.

According to an embodiment of the present disclosure, the common electrode and the connection electrode are formed in a single patterning process.

According to an embodiment of the present disclosure, the method of manufacturing an array substrate further comprises a step of forming a common electrode line on one side of the common electrode away from the substrate, wherein the gate electrode and the common electrode line are formed in a single patterning process.

According to an embodiment of the present disclosure, the step of forming an active layer comprises: forming a semiconductor layer on the gate insulating layer; forming a first via hole to expose the connection electrode at the bottom of the first via hole, and patterning the semiconductor layer to obtain the active layer, wherein the source electrode is electrically connected to the connection electrode through the first via hole.

According to an embodiment of the present disclosure, the step of forming a first via hole to expose the connection electrode at the bottom of the first via hole, and patterning the semiconductor layer comprises: disposing a semi-transparent film mask on the semiconductor layer, wherein in a direction perpendicular to the substrate, a region on the semi-transparent film mask corresponding to the gate electrode is an opaque region, a region corresponding to the connection electrode is a fully transparent region, and the rest region is a semi-transparent region; etching the fully transparent region to form the first via hole; removing the semi-transparent region; removing the semiconductor layer not covered by the opaque region through etching, and then removing the opaque region to form the active layer.

According to an embodiment of the present disclosure, after forming the drain electrode and the source electrode and before forming the pixel electrode, the method further comprises: forming a protective layer covering the drain electrode, the active layer, the source electrode, the connection electrode and the gate insulating layer; disposing a mask on the protective layer; etching the protective layer to form a second via hole, a third via hole and a passivation layer; wherein, the pixel electrode is electrically connected to the connection electrode through the second via hole, and is electrically connected to the common electrode line through the third via hole.

According to an embodiment of the present disclosure, in the direction perpendicular to the substrate, the second via hole does not overlap the source electrode.

REFERENCE NUMERALS

Figure 1:
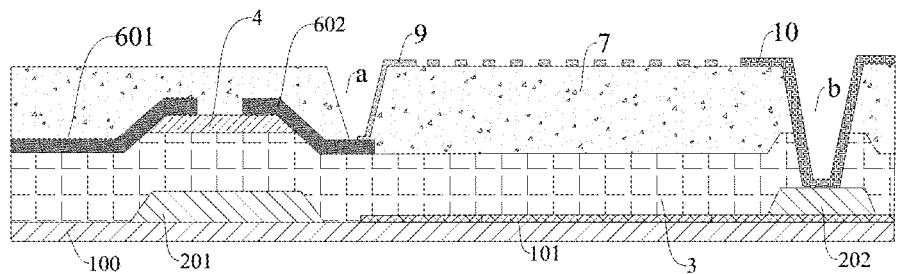
FIG. 1 is schematic structure diagram showing an existing array substrate.

100: substrate 101: common electrode 102: connection electrode 201: gate electrode 202: common electrode line 3: gate insulating layer 4: active layer 42: semiconductor layers 5, 8: semi-transparent film mask 601: drain electrode 602: source electrode 7: passivation layer 72: protective layer 9: pixel electrode 10: common connection electrode

DETAILED DESCRIPTION OF PREFERRED EMBODIMENTS

Below, embodiments of the present disclosure will be described in detail. The embodiments described below are illustrative, which are merely used to interpret the present disclosure, but cannot be understood as limitation to the present disclosure. For the specific techniques or conditions not specified in the embodiments, they are performed according to the techniques or conditions described in the literature in this field or according to the product specifications. The reagents or instruments without specified manufacturers are all available through the purchase of conventional products.

The present disclosure was accomplished based on the following findings of the inventor.

Figure 2:
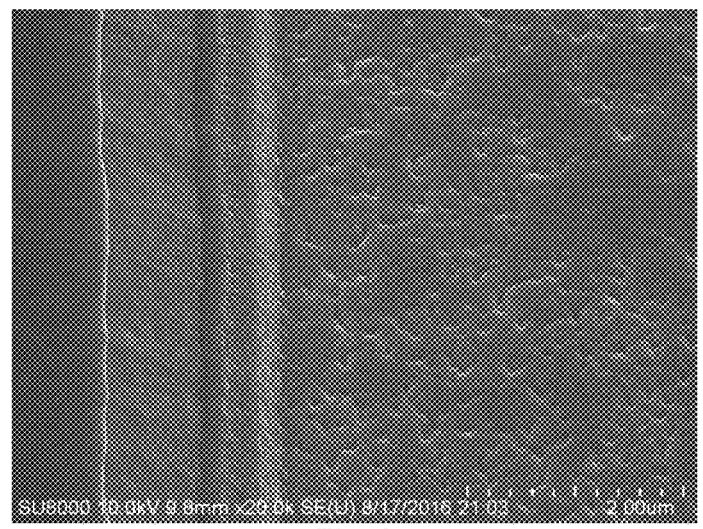
FIG. 2 shows the topography of a Cu metal surface after etching in the prior art.

In a conventional array substrate, refer to FIG. 1, a pixel electrode 9 is connected to a source electrode 602 through the hole A, and a common electrode 101 is connected to an adjacent common electrode 101 through a common electrode line 202 and a common connection electrode 10 in a hole B. The hole A and hole B are formed in one dry etching process. To form hole A, it only needs to etch through the passivation layer 7, while to form hole B, it needs to etch through the passivation layer 7 and the gate insulating layer 3 at the same time. In order to maintain the etching uniformity of the glass substrate 100 and prevent a non-cut-through via hole, the etching generally has an overetching amount of about 30% to 40%, with a base line of timing when the hole B etches through. In general, when the hole B is only 30% over-etched, the overetching amount of the hole A will reach about 400%-500%. Therefore, after the passivation layer 7 at the hole A has been etched through, most of the time, the metal surface of the source electrode 602 at the hole A is etched, resulting in a large overetching amount on the metal surface of the source electrode 602. In dry etching, the longer the bombardment time on a Cu metal surface by the plasma, the greater the damage to the Cu surface. After a long time of over etching, the Cu surface oxidizes and forms many pits caused by ion bombardment (FIG. 2 shows the topography of a Cu metal surface after etching). The presence of these pits causes the contact resistance to increase when the pixel electrode 9 overlaps the Cu surface, resulting in insufficient charging of the pixel and causing defects such as flickering. To reduce the overetching amount of the hole A, it can be avoided by using two masks and etching the hole A and the hole B separately. However, it will lead to an increase in the number of masks and a substantial increase in cost. To this end, the inventor conducted intensive studies and found that a connection electrode can be provided when forming the common electrode. In the etching of a via hole, a pixel electrode can be connected to a source electrode through the connection electrode, thereby the problem of high contact resistance due to a large amount of overetching over the source electrode in via hole etching can be avoided, effectively reducing the contact resistance of the Cu product, preventing flicker and pixel defects caused by high contact resistance, and improving the yield rate.

For this reason, one of the objects of the present disclosure is to provide an array substrate that can effectively reduce contact resistance, prevent flicker, reduce pixel defects, and increase production yield.

In one aspect of the present disclosure, the present disclosure provides an array substrate, which may be used in a display device such as a liquid crystal display device and the like. According to an embodiment of the present disclosure, refer to FIG. 3, the array substrate comprises: a substrate 100, a gate electrode 201, a common electrode 101, a connection electrode 102, a gate insulating layer 3, an active layer 4, a drain electrode 601, a source electrode 602, and a pixel electrode 9, wherein the source electrode 602 is electrically connected to the pixel electrode 9 by the connection electrode 102. In general, an array of pixels and an array of transistors for controlling the array of pixels are formed on the array substrate. Each transistor in the transistor array can control one corresponding pixel in the pixel array. In each of the drawings of the present disclosure, only one transistor and a corresponding pixel are shown schematically for simplicity. The inventor has unexpectedly discovered that, through connecting the pixel electrode to the source electrode by a connection electrode, the problem of high contact resistance due to a large amount of overetching can be avoided without increasing the number of masks, which can effectively reduce the contact resistance and prevent flicker and pixel defects caused by high contact resistance, and improve the yield rate.

According to the embodiment of the present disclosure, the specific kind of the substrate that can be used is not particularly limited, and it can be flexibly selected by those skilled in the art according to needs. In some embodiments of the present disclosure, the substrate employed includes, but are not limited to, a glass substrate, a ceramic substrate, a metal substrate, or a polymer substrate, etc. As a result, a wide range of materials having low cost and good performance can be used for the substrate.

According to embodiments of the present disclosure, the specific material for forming the gate electrode is also not particularly limited, and any material known in the art for forming the gate electrode may be used. In order to improve the performance of the array substrate, a conductive material with good conductivity may be selected to form the gate electrode, including, for example, but not limited to, metal, doped polysilicon, and the like.

According to an embodiment of the present disclosure, the connection electrode is disposed in the same layer as the common electrode. Thus, they can be formed by a single patterning process. The operation step is simple and is conducive to the development trend of light and thin panels.

It should be noted that the "single patterning process" used in this description includes steps of forming a film layer structure, coating a photoresist, exposing, developing, etching, and removing the photoresist. For example, forming the connection electrode and the common electrode can be performed by the following steps: forming an electrode layer on one side of the substrate, coating a photoresist on the electrode layer, performing exposing and developing processes on the photoresist, and then etching the exposed electrode layer, removing the photoresist to obtain a patterned structure of the connection electrode and the common electrode.

According to the embodiment of the present disclosure, the specific material for forming the connection electrode is also not particularly limited as long as it can be prevented from being damaged during the etching step and has a good conduction effect. In some embodiments of the present disclosure, the material for forming the connection electrode includes indium tin oxide. Thus, it is possible to avoid damage during dry etching, effectively connecting the source electrode and the pixel electrode.

According to the embodiment of the present disclosure, the material for forming the common electrode is not limited, which can be flexibly selected by those skilled in the art according to needs, for example, including but not limited to indium tin oxide and the like. In the embodiment of the present disclosure, the common electrode may be provided in the same layer as the connection electrode, that is, they can be formed through one patterning process. Therefore, the common electrode and the connection electrode may be formed using the same material.

According to an embodiment of the present disclosure, the source electrode and the pixel electrode do not overlap in a direction perpendicular to the substrate surface. As a result, damage to the source electrode during etching can be avoided and the contact resistance can be reduced. Specifically, in the embodiment of the present disclosure, according to the needs of the manufacture steps, the source electrode is generally connected to the connection electrode through a via hole first, and then the pixel electrode is connected to the connection electrode through another via hole. With an arrangement in which the source electrode and the pixel electrode do not overlap in a direction perpendicular to the substrate plane, when the pixel electrode is connected to the connection electrode, the via hole etching process does not affect the source electrode, thereby reducing the contact resistance and improving the performance of the array substrate.

According to the embodiment of the present disclosure, the material for forming the drain electrode and the source electrode is also not particularly limited, and it can be flexibly selected by those skilled in the art according to actual needs. In some embodiments of the present disclosure, in order to further reduce the RC delay and the resistance of the signal line, reduce the wiring width and the thickness of the film layer, and thereby improve the quality of the display, the material for forming the drain electrode and the source electrode may comprise copper. As a result, the resistance is small, and the RC delay of the signal line can be greatly reduced. At the same time, a thin metal wire can be used and the film thickness can be made thin. Further, the aperture ratio of the LCD is increased and the cost is greatly reduced.

Figure 4:
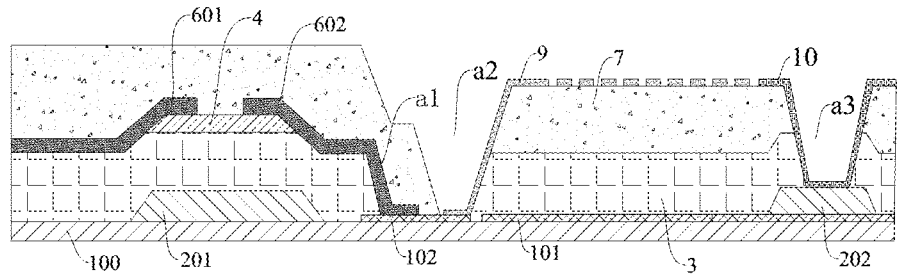
FIG. 4 is a schematic structure diagram showing an array substrate according to another embodiment of the present disclosure.
Figure 5:
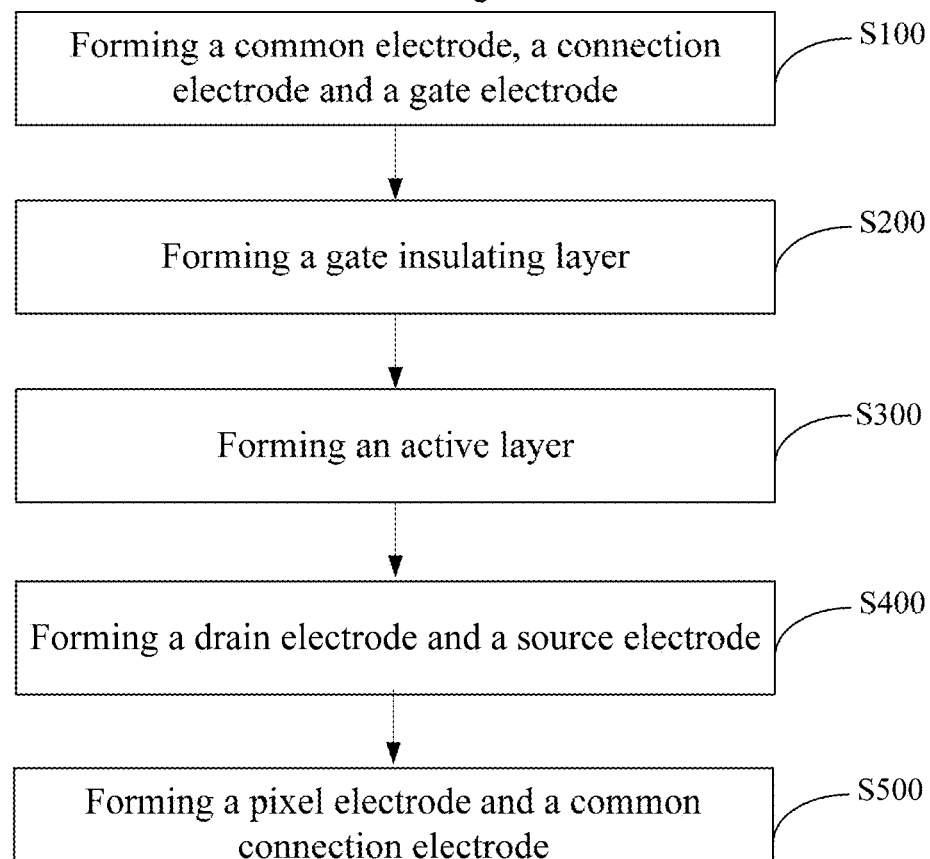
FIG. 5 and FIGS. 6A-6H are schematic flow diagrams illustrating a method for manufacturing an array substrate according to an embodiment of the present disclosure.

According to an embodiment of the present disclosure, refer to FIG. 4, the array substrate may further include a common electrode line 202 and a passivation layer 7, wherein the common electrode line 202 is disposed on one side of the common electrode 101 away from the substrate 100, and is disposed in the same layer as the gate electrode 201. The passivation layer 7 is disposed on one side of the drain electrode 601, the active layer 4, the source electrode 602, the connection electrode 102, and the gate insulating layer 3 away from the substrate 100. As a result, the performance of the array substrate can be further improved, and the passivation layer can provide good protection for other film layers on the array substrate.

According to an embodiment of the present disclosure, refer to FIG. 4, the structure of the array substrate of the present disclosure will be described in detail. Specifically, the array substrate includes a substrate 100. The gate electrode 201, the common electrode 101, and the connection electrode 102 are disposed on one side of the substrate 100. The common electrode line 202 is disposed on one side of the common electrode 101 away from the substrate 100, and is disposed in the same layer as the gate electrode 201. The gate insulating layer 3 is disposed on one side of the substrate 100, the gate electrode 201, the connection electrode 102, the common electrode 101, and the common electrode line 202 away from the substrate 100. The active layer 4 is disposed on one side of the gate insulating layer 3 away from the substrate 100 and overlaps the gate electrode 201 in a direction perpendicular to the substrate surface. The drain electrode 601 is disposed on one side of the gate insulating layer 3 and the active layer 4 away from the substrate 100. The source electrode 602 is disposed on one side of the gate insulating layer 3, the active layer 4, and the connection electrode 102 away from the substrate 100. The passivation layer 7 is disposed on one side of the drain electrode 601, the active layer 4, the source electrode 602, the connection electrode 102, and the gate insulating layer 3 away from the substrate 100. The pixel electrode 9 is disposed on one side of the connection electrode 102, the gate insulating layer 3 and the passivation layer 7 away from the substrate 100. The common connection electrode 10 is disposed on one side of the passivation layer 7 and the common electrode line 202 away from the substrate. A first via hole a1 penetrates the gate insulating layer 3, and the source electrode 602 is electrically connected to the connection electrode 102 through the first via hole a1. A second via hole a2 penetrates the passivation layer 7 and the gate insulating layer 3. The pixel electrode 9 is electrically connected to the connection electrode 102 through the second via hole a2. A third via hole a3 penetrates the passivation layer 7 and the gate insulating layer 3. The common connection electrode 10 is electrically connected to the common electrode line 202 through the third via hole a3, thereby the common electrode 101 being connected to an adjacent common electrode. Therefore, without increasing the number of masks, the problem of high contact resistance at the source electrode due to a large amount of overetching in the etching process can be avoided, and problems such as flicker and defective pixels can be reduced.

It should be noted that the drawings of the present disclosure illustrate a schematic structure diagram of one pixel unit on an array substrate. An array substrate includes a plurality of pixel units arranged in an array. A common electrode 101 connected to an adjacent common electrode described above means that the common electrodes in adjacent pixel units are connected to each other through the common connection electrode.

According to an embodiment of the present disclosure, the material for forming the active layer is not particularly limited, and it can be flexibly selected by those skilled in the art according to needs. In some embodiments of the present disclosure, the active layer may be made of a-Si, indium gallium zinc oxide or the like. As a result, a conductive channel can be formed effectively with an ideal conduction effect, which is favorable for improving the performance of the array substrate.

According to an embodiment of the present disclosure, the specific material for forming the passivation layer is not particularly limited, and any material known in the art suitable for forming a passivation layer may be used. In some embodiments of the present disclosure, materials that may be employed include, but are not limited to, silicon oxide, silicon nitride, and the like. Thus, a wide range of materials can be used, the film can be formed easily and can effectively protect other film layer structures on the array substrate, which is favorable for improving the performance of the array substrate.

According to an embodiment of the present disclosure, the material for forming the common electrode line is not particularly limited, and it can be flexibly selected by those skilled in the art according to needs, as long as the conductive requirement is satisfied. In some embodiments of the present disclosure, the common electrode line and the gate electrode can be formed in a single patterning process. Therefore, the material for forming the common electrode line may be the same as the material for forming the gate electrode, which will not be repeated herein.

In another aspect of the present disclosure, a display device is provided. According to an embodiment of the present disclosure, the display device comprises the array substrate described above. Those skilled in the art can understand that the display device has all the features and advantages of the aforementioned array substrate, which will not be described in detail herein.

According to the embodiment of the present disclosure, the specific type of the display device is not particularly limited. It may be any device or apparatus known in the art having a display function. For example, it may include but not limited to a display panel, a mobile phone, a tablet computer, a computer display, a TV set, a game console, a wearable device, and any home appliance, living appliance with a display function.

According to an embodiment of the present disclosure, in addition to the array substrate described above, the display device of the present disclosure also includes those structures and components necessarily provided in a conventional display device. For example, it may also include a housing, necessary circuit structures etc, which will not be described in detail herein.

In still another aspect of the present disclosure, a method for manufacturing an array substrate is provided. According to an embodiment of the present disclosure, refer to FIG. 5 and FIGS. 6A to 6D, the method comprises the following steps.

Figure 6A:
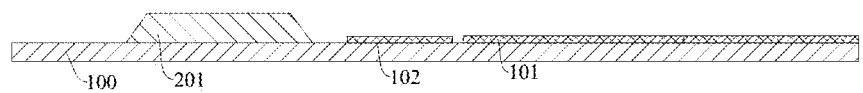

S100: forming a common electrode 101, a connection electrode 102, and a gate electrode 201 on one side of the substrate 100 in sequence, as shown in the schematic structure diagram of FIG. 6A.

According to an embodiment of the present disclosure, the specific method for forming the common electrode, the connection electrode and the gate electrode is not particularly limited, and it can be flexibly selected by those skilled in the art according to needs. In some embodiments of the present disclosure, in this step, the common electrode, the connection electrode, and the gate electrode may be sequentially formed by coating, exposing, and etching processes. Thus, the operation is simple, convenient, and easy to control. There is no special requirement for equipment and technicians, and it is easy to achieve large-scale production. Specifically, in some embodiments, the connection electrode and the common electrode are disposed in the same layer and can be formed through a single patterning process, that is, an electrode layer is formed on one side of the substrate, and then a photoresist is coated on one side of the electrode layer away from the substrate. Exposing and developing processes are performed on the photoresist. Then, the electrode layer is etched, and the photoresist is removed to form the connection electrode and the common electrode. According to the embodiment of the present disclosure, the substrate, the gate electrode, the common electrode, and the connection electrode involved in the method are consistent as those described in the array substrate described above, and will not be repeated herein.

Figure 6B:
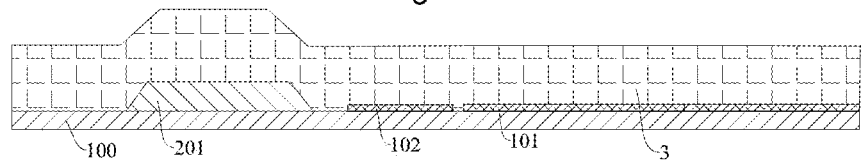

S200: forming a gate insulating layer 3, as shown in the schematic structure diagram of FIG. 6B.

According to an embodiment of the present disclosure, the specific method for forming the gate insulating layer is not particularly limited, and it can be flexibly selected by those skilled in the art according to needs. In some embodiments of the present disclosure, the method for forming the gate insulating layer includes, but is not limited to, a deposition method, a plating method, and the like. Specifically, it may include, but not limited to, chemical vapor deposition, physical vapor deposition, magnetron sputtering, vacuum evaporation, and the like. Thus, its process is mature, easy to operate, and has low cost.

According to an embodiment of the present disclosure, the material for forming the gate insulating layer is not particularly limited, and it can be any material that can used for a gate insulating layer in the art, as long as the requirement of the insulation performance is satisfied. In some embodiments of the present disclosure, the material for forming the gate insulating layer includes but is not limited to silicon oxide, silicon nitride, polymers, and the like. Thus, a wide range of materials having a good insulation performance and low cost can be used.

Figure 6C:
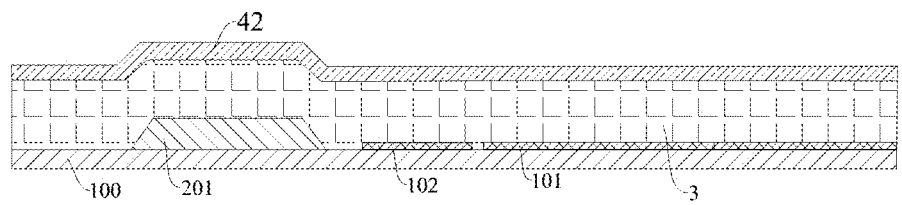
Figure 6D:
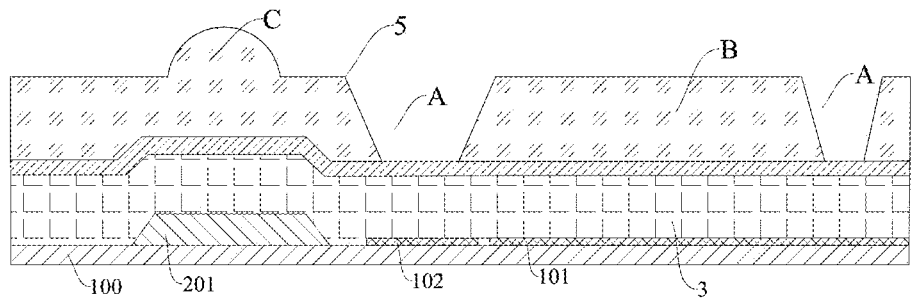
Figure 6E:
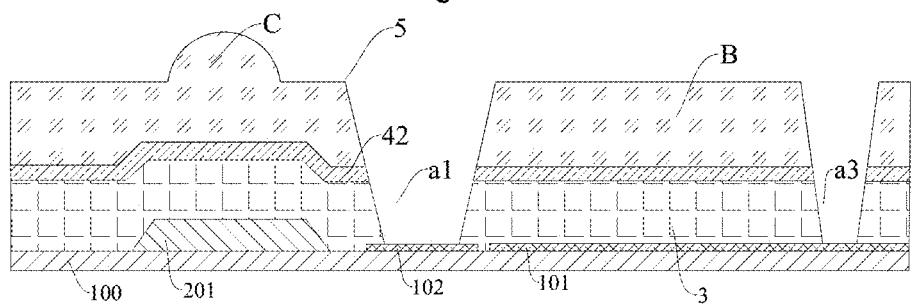
Figure 6F:
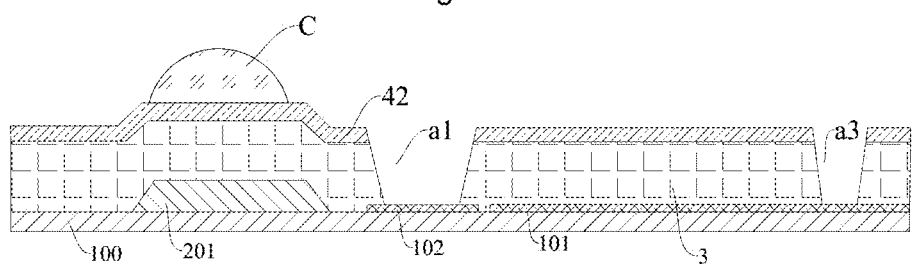
Figure 6G:
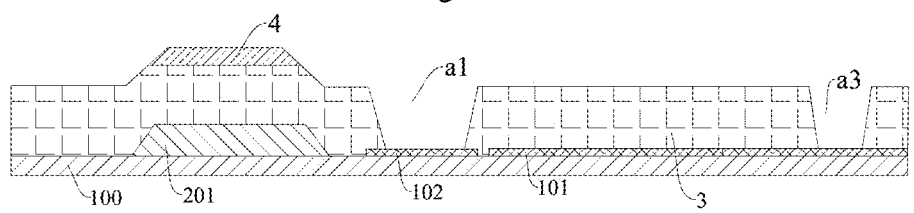

S300: forming an active layer 4, as shown in the schematic structure diagram of FIG. 6G.

According to an embodiment of the present disclosure, in this step, the active layer 4 may be formed in the following steps.

Firstly, a semiconductor layer 42 is formed on one side of the gate insulating layer 3 away from the substrate 100, as shown in the schematic structure diagram of FIG. 6C. Specifically, the specific method for forming the semiconductor layer 42 is not particularly limited, and chemical vapor deposition, physical vapor deposition etc may be used, for example. In some specific examples of the present disclosure, the method that may be employed includes but is not limited to magnetron sputtering, vacuum evaporation, and the like. Thus, its process is mature, easy to operate, and has low cost.

Then, through one masking process, a first via hole a1 is formed on one side of the connection electrode 102 away from the substrate 100, a third via hole a3 is formed on one side of the common electrode away from the substrate, and the semiconductor layer 42 is patterned to obtain the active layer 4. In a later step, the source electrode 602 will be electrically connected to the connection electrode 102 through the first via hole a1.

According to some embodiments of the present disclosure, forming a first via hole a1 on one side of the connection electrode 102 away from the substrate 100, forming a third via hole a3 on one side of the common electrode away from the substrate, and patterning the semiconductor layer 42 may be performed in the following steps:

disposing a semi-transparent film mask 5 on one side the semiconductor layer 42 away from the substrate 100, wherein in a direction perpendicular to the substrate surface, a region on the semi-transparent film mask 5 corresponding to the gate electrode 201 is an opaque region C, a region corresponding to the connection electrode 102 and the common electrode 101 is a fully transparent region A, and the rest region is a semi-transparent region B, as shown in the schematic structure diagram of FIG. 6D;

etching the fully transparent region A to form the first via hole a1 and the third via hole a3, as shown in the schematic structure diagram of FIG. 6E. According to an embodiment of the present disclosure, the method for etching used in these steps is not particularly limited, and it can be flexibly selected by those skilled in the art according to needs, as long as the via holes can be formed effectively without any negative effects on other structures. In some specific examples of the present disclosure, dry etching may be used, whereby the operation is convenient and fast without affecting the performance of the array substrate.

The semi-transparent region B is removed, as shown in the schematic structure diagram of FIG. 6F. According to an embodiment of the present disclosure, the method for removing the semi-transparent region B of this step is not particularly limited, and it can be flexibly selected by those skilled in the art according to needs. In some embodiments of the present disclosure, the semi-transparent region B may be removed by an ashing method. Thus, its process is simple, convenient, and the cost is low.

The semiconductor layer 42 not covered by the opaque region C is etched, and the opaque region C is removed to form the active layer 4, as shown in the schematic structure diagram of FIG. 6G. Thus, the active layer 4, the first via hole a1, and the third via hole a3 can be formed in one masking process, with simple operation steps and low cost. The source electrode 602 may be electrically connected to the connection electrode 102 in a subsequent step by providing the first via hole a1, and common electrodes 101 in adjacent pixel units can be connected by providing the third via hole a3. According to an embodiment of the present disclosure, the specific method for etching the semiconductor layer in these steps is not particularly limited, as long as the active layer 4 can be effectively formed without affecting other structures.

Figure 6H:
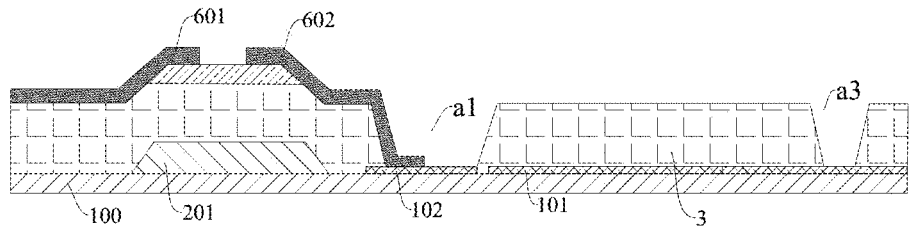
Figure 7:
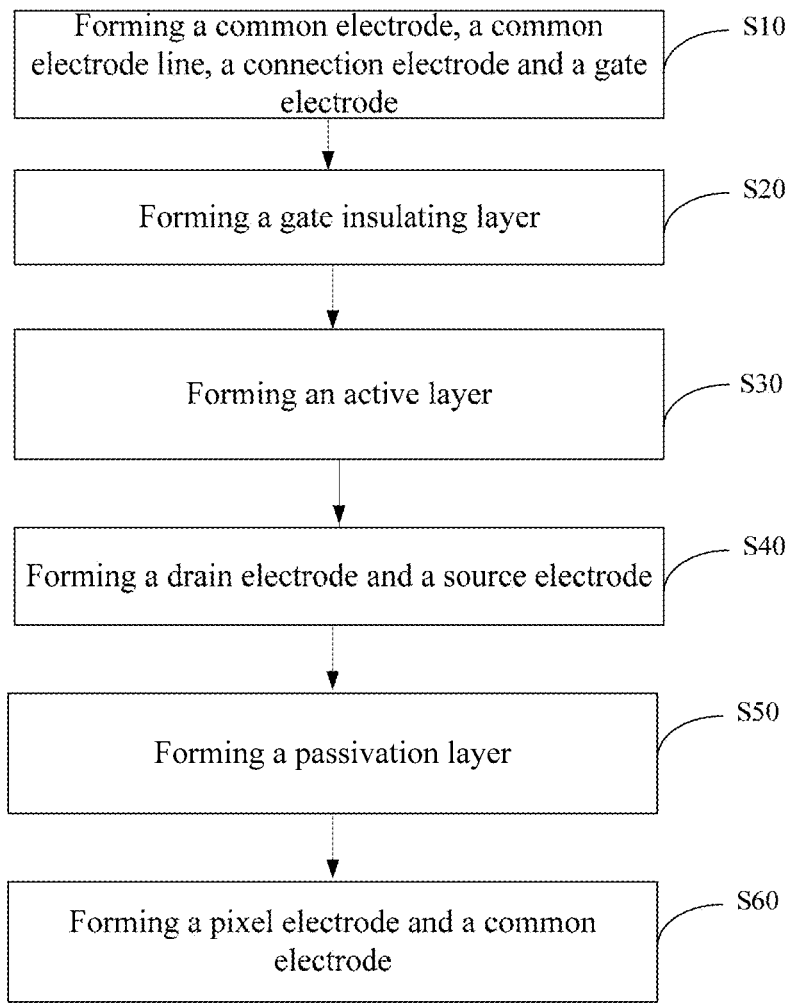
FIG. 7 and FIGS. 8A-8K are schematic flow diagrams illustrating a method for manufacturing an array substrate according to another embodiment of the present disclosure.

S400: forming a drain electrode 601 and a source electrode 602, the source electrode 602 being electrically connected to the connection electrode 102, as shown in the schematic structure diagram of FIG. 6H.

According to an embodiment of the present disclosure, in this step, the source electrode and the drain electrode are formed by plating a source/drain metal on one side of the gate insulating layer away from the substrate, and performing other exposing and etching processes, wherein the source electrode partially overlaps the connection electrode. Thus, the operation is simple, convenient, and easy to control. There is no special requirement for equipment and technicians, and it is easy to achieve large-scale production.

According to the embodiment of the present disclosure, the drain electrode and the source electrode involved in this step are the consistent with those of the array substrate described above, and will not be described herein.

Figure 3:
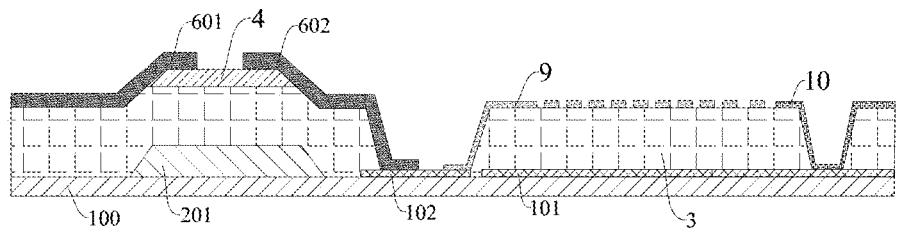
FIG. 3 is a schematic structure diagram showing an array substrate according to an embodiment of the present disclosure.

S500: forming a pixel electrode 9 and a common connection electrode 10, wherein the pixel electrode 9 is electrically connected to the connection electrode 102, and is electrically connected to the source electrode 602 through the connection electrode 102, as shown in the schematic structure diagram of FIG. 3. According to an embodiment of the present disclosure, the pixel electrode and the common connection electrode described in this step may be formed through a single patterning process. Specifically, the pixel electrode and the common connection electrode may be formed through coating, exposing, and etching. Therefore, the source electrode is electrically connected to the pixel electrode by providing the connection electrode, so as to avoid direct connection between the source electrode and the pixel electrode in the prior art, which otherwise may cause damage to the source electrode during the etching process, resulting in an increase in contact resistance and a problem of flicker or defective pixels. Thereby, a higher yield of the array substrate and better performance thereof can be obtained. Moreover, this method does not increase the number of masks and the cost is low.

The inventor has found that effective and fast manufacturing of the array substrate described above can be achieved using this method. The method has simple steps, greatly improves the production yield and production efficiency, and is easy to large-scale manufacturing. Therefore, without increasing the number of masks, the problem of high contact resistance at the source electrode due to a large amount of overetching in etching can be avoided, and problems such as flicker and defective pixels can be reduced.

According to an embodiment of the present disclosure, for an array substrate having a different structure, this method may further include the step of forming a common electrode line and a passivation layer. A method for manufacturing an array substrate will be described in detail below with reference to FIGS. 7 and 8A to 8K. Specifically, the method for manufacturing an array substrate may comprise the following steps.

Figure 8A:
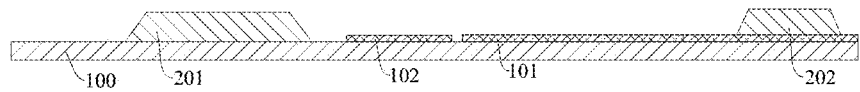

S10: forming a common electrode 101, a common electrode line 202, a connection electrode 102, and a gate electrode 201 on one side of the substrate 100 in sequence, as shown in the schematic structure diagram of FIG. 8A.

Specifically, in this step, the common electrode 101 and the connection electrode 102 may be formed in the same step as step S100, and then the gate electrode 201 and the common electrode line 202 may be formed through a single patterning process, in which the common electrode line 202 is formed on one side of the common electrode 101 away from the substrate 100, and is electrically connected to the common electrode 101.

Figure 8B:
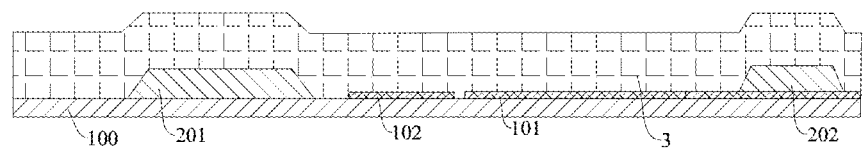

S20: forming a gate insulating layer 3, as shown in the schematic structure diagram of FIG. 8B.

According to an embodiment of the present disclosure, this step is consistent with the description given in step S200, which will not be described herein.

Figure 8C:
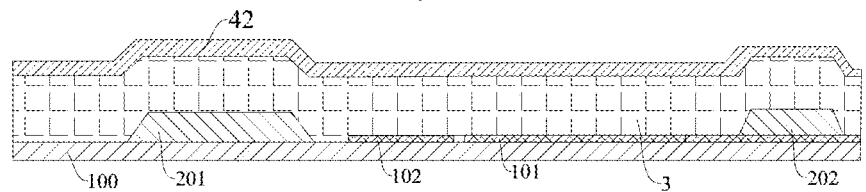
Figure 8D:
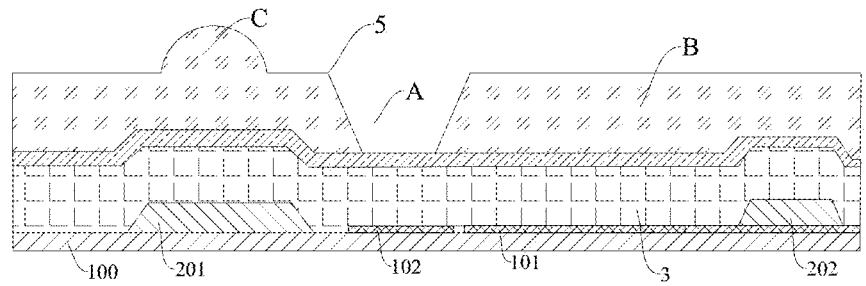
Figure 8E:
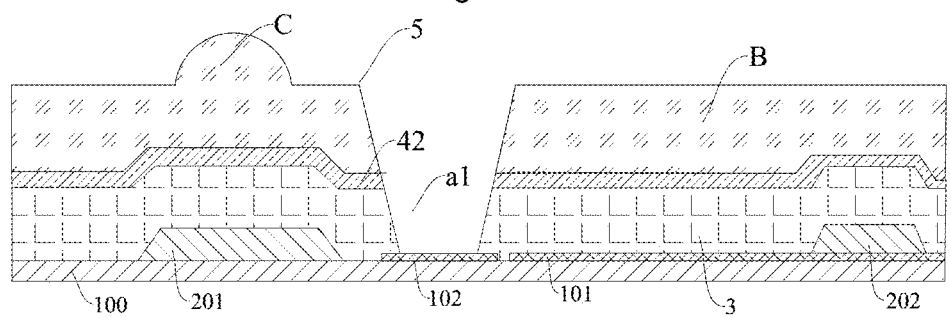
Figure 8F:
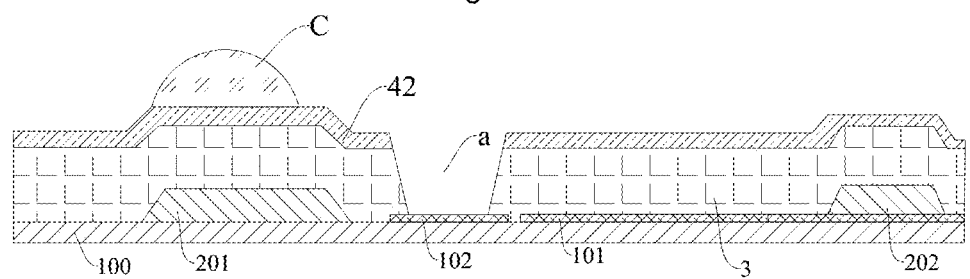
Figure 8G:
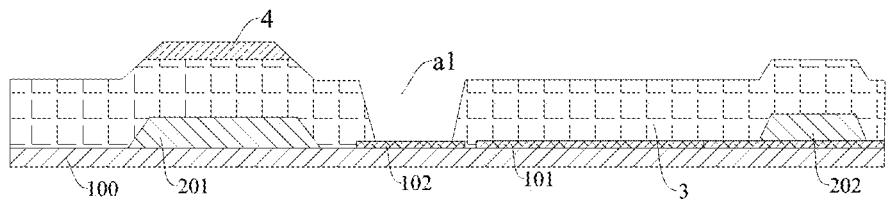

S30: forming an active layer 4, as shown in the schematic structure diagram of FIG. 8G.

According to an embodiment of the present disclosure, in this step, the active layer 4 may be formed in the following steps.

Firstly, a semiconductor layer 42 is formed on one side of the gate insulating layer 3 away from the substrate 100, as shown in the schematic structure diagram of FIG. 8C. Specifically, the specific method for forming the semiconductor layer 42 is not particularly limited, and chemical vapor deposition, physical vapor deposition etc may be used, for example. In some specific examples of the present disclosure, the method that may be employed includes but is not limited to magnetron sputtering, vacuum evaporation, and the like. Thus, its process is mature, easy to operate, and has low cost.

Next, through one masking process, a first via hole a1 is formed on one side of the connection electrode 102 away from the substrate 100, and the semiconductor layer 42 is patterned to obtain the active layer 4, wherein the source electrode 602 is electrically connected to the connection electrode 102 through the first via hole a1.

According to some embodiments of the present disclosure, forming a first via hole a1 on one side of the connection electrode 102 away from the substrate 100 and patterning the semiconductor layer 42 through one masking process may be performed in the following steps:

disposing a semi-transparent film mask 5 on one side the semiconductor layer 42 away from the substrate 100, wherein in a direction perpendicular to the substrate surface, a region on the semi-transparent film mask 5 corresponding to the gate electrode 201 is an opaque region C, a region corresponding to the connection electrode 102 is a fully transparent region A, and the rest region is a semi-transparent region B, as shown in the schematic structure diagram of FIG. 8D;

etching the fully transparent region A to form the first via hole a1, as shown in the schematic structure diagram of FIG. 8E. According to an embodiment of the present disclosure, the method for etching used in these steps is not particularly limited, and it can be flexibly selected by those skilled in the art according to needs, as long as the via hole can be formed effectively without any negative effects on other structures. In some specific examples of the present disclosure, dry etching may be used, whereby the operation is convenient and fast without affecting the performance of the array substrate.

The semi-transparent region B is removed, as shown in the schematic structure diagram of FIG. 8F. According to an embodiment of the present disclosure, the method for removing the semi-transparent region B of this step is not particularly limited, and it can be flexibly selected by those skilled in the art according to needs. In some embodiments of the present disclosure, the semi-transparent region B may be removed by an ashing method. Thus, its process is simple, convenient, and the cost is low.

The semiconductor layer 42 not covered by the opaque region C is etched, and the opaque region C is removed to form the active layer 4, as shown in the schematic structure diagram of FIG. 8G. Thus, the active layer 4 and the first via hole a1 can be formed in one masking operation, with simple operation steps and low cost. According to an embodiment of the present disclosure, the specific method for etching the semiconductor layer in these steps is not particularly limited, as long as the active layer 4 can be effectively formed without affecting other structures.

Figure 8H:
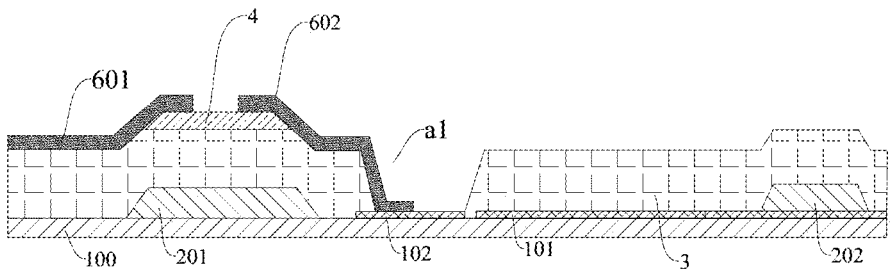

S40: forming a drain electrode 601 and a source electrode 602, the source electrode 602 being electrically connected to the connection electrode 102, as shown in the schematic structure diagram of FIG. 8H.

According to an embodiment of the present disclosure, in this step, the source electrode 602 and the drain electrode 601 are formed by plating a source/drain metal on one side of the gate insulating layer 3 away from the substrate 100, and performing other exposing and etching processes, wherein the source electrode 602 partially overlaps the connection electrode 102 through the first via hole a1. Thus, the operation is simple, convenient, and easy to control. There is no special requirement for equipment and technicians, and it is easy to achieve large-scale production.

Figure 8I:
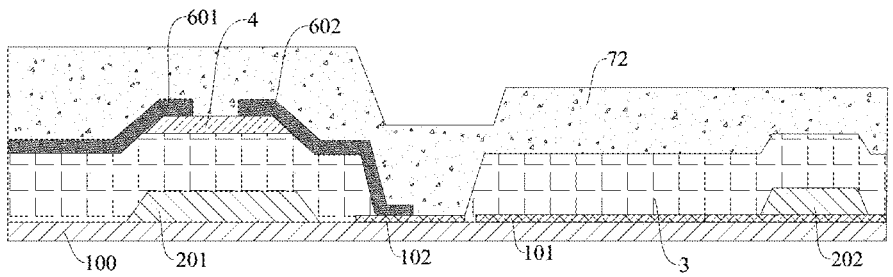
Figure 8J:
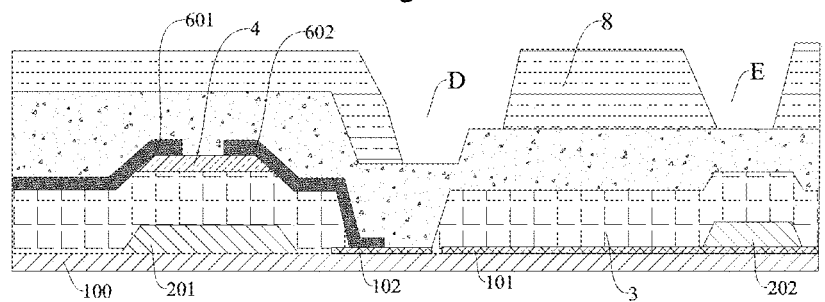
Figure 8K:
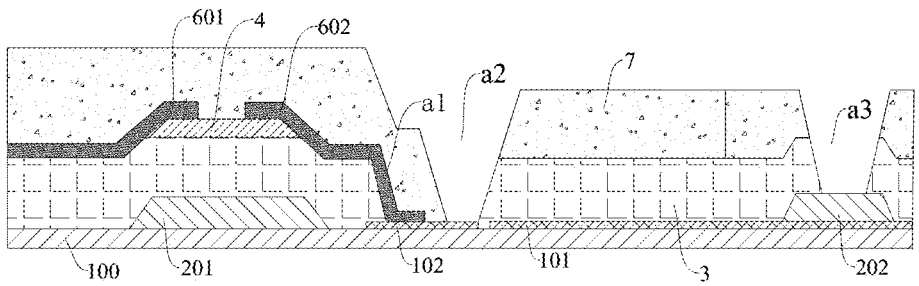

S50: forming a passivation layer 7, as shown in the schematic structure diagram of FIG. 8K.

According to an embodiment of the present disclosure, the passivation layer 7 may be formed in the following steps.

forming a protective layer 72 on one side of the drain electrode 601, the active layer 4, the source electrode 602, the connection electrode 102, and the gate insulating layer 3 away from the substrate 100, as shown in the schematic structure diagram of FIG. 8I. According to an embodiment of the present disclosure, the specific method for forming the protective layer 72 is not particularly limited, and chemical vapor deposition, physical vapor deposition etc may be used, for example. In some specific examples of the present disclosure, the method that may be employed includes but is not limited to magnetron sputtering, vacuum evaporation, and the like. Thus, its process is mature, easy to operate, and has low cost.

A mask 8 is disposed on the protective layer 72, as shown in the schematic structure diagram of FIG. 8J. According to an embodiment of the present disclosure, the mask 8 used in this step may be a semi-transparent film mask with fully transparent regions D and E, and in the direction perpendicular to the substrate surface, the fully transparent region D does not overlap the source electrode 602. Therefore, in the subsequent etching step, no etching damage is caused to the source electrode, the contact resistance can be effectively reduced, and problems such as flicker and defective pixels can be avoided, thereby the production yield of the array substrate can be improved, and its performance can be improved.

The protective layer 72 is etched to form a second via hole a2, a third via hole a3, and a passivation layer 7. The second via hole a2 is formed on one side of the connection electrode 102 away from the substrate 100. The third via hole a3 is formed on one side of the common electrode line 202 away from the substrate 100, as shown in the schematic structure diagram of FIG. 8K. According to an embodiment of the present disclosure, dry etching may be performed in this step, which can effectively etch the passivation layer without negatively affecting other structures. The process is mature and its operation is convenient.

S60: forming a pixel electrode 9 and a common connection electrode 10, as shown in the schematic structure diagram of FIG. 4.

According to an embodiment of the present disclosure, the pixel electrode 9 and the common connection electrode 10 described in this step may be formed through a single patterning process. Specifically, they may be formed through coating, exposing, and etching. Wherein, the pixel electrode 9 is electrically connected to the connection electrode 102 through the second via hole a2, and is electrically connected to the common electrode line 202 through the third via hole a3. The common connection electrode 10 is used to electrically connect common electrodes of adjacent pixel units. As a result, the pixel electrode 9 and the source electrode 602 can be electrically connected to each other through the connection electrode 102 to avoid damage to the source electrode 602 during the etching process, which otherwise may result in high contact resistance, thereby reducing the problem such as flicker and defective pixels.

In the description of the present invention, it is to be understood that the azimuth or positional relationship indicated by the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential" and the like is based on the azimuth or positional relationship shown in the drawings and is merely for the purpose of facilitating the description of the invention and simplified description, rather than indicating or implying that the device or element referred to must have a specific orientation, constructed and operated in a particular orientation and therefore can not be construed as limiting the invention.

Furthermore, the terms "first" and "second" are used for descriptive purposes only, and are not to be construed as indicating or implying relative importance or implicitly indicating the number of indicated technical features. Thereby, features defined by "first", "second" may expressly or implicitly include one or more of the features. Unless otherwise indicated, the phrase "a plurality of" in this description means "two or more".

In the description of the present invention, it should be noted that the terms "install", "connect", "connection", "mount" should be broadly understood, unless otherwise specified and defined, for example, "connection" may be a fixed connection or a removable connection, or an integral connection, or a mechanical connection or an electrical connection, or a direct connection, or an indirect connection with an intermediate medium. It can be the internal communication of two components or the interaction between two components. For those of ordinary skill in the art, the specific meanings of the above terms in this invention can be interpreted according to particular situations.

In the present disclosure, unless specifically stated and defined otherwise, a first feature "above" or "below" a second feature may be that the first and second features are in direct contact, or that the first and second features are in indirect contact through an intermediary. Also, a first feature "on", "over" or "above" a second feature may be that the first feature directly above or diagonally above the second feature, or simply indicating that the first feature is higher in height than the second feature. A first feature "under", "below" or "beneath" the second feature may be that the first feature directly below or diagonally below the second feature, or merely indicating that the height of first feature is less than the height of the second feature.

In the description of this specification, reference throughout this specification to "one embodiment", "some embodiments", "illustrative embodiments", "examples", "specific examples", or "some examples" means that a particular feature, structure, material or characteristic described in connection with the embodiment is included in at least one embodiment of the present invention. Therefore, illustrative references to the above terms in various portions of this specification are not necessarily all referring to the same embodiment or example. Furthermore, the particular features, structures, materials or characteristics may be combined as suitable in one or more embodiments of the invention. In addition, those skilled in the art may combine the different embodiments or examples described in this specification and features of different embodiments or examples without conflicting with each other.

Although embodiments of the present disclosure have been illustrated and described above, it will be understood that the above-described embodiments are exemplary and not to be construed as limiting the present disclosure. Those of ordinary skill in the art may make variations, modifications, substitutions, and variations to the above described embodiments within the scope of the present disclosure.

What is claimed is:

1. An array substrate, comprising:
    a plurality of pixels, each of the plurality of pixels having:
        a pixel electrode; and a common electrode electrically connected to a common electrode of an adjacent pixel of the plurality of pixels;
    one or more transistors, each of the one or more transistors having a source electrode; and
    a connection electrode for electrically connecting the pixel electrode to a corresponding source electrode,
    wherein the pixel electrode and the corresponding source electrode both directly contact a same surface of the connection electrode, the pixel electrode does not directly contact the corresponding source electrode, the connection electrode is disposed in a same layer as the common electrode, the connection electrode and the common electrode are formed simultaneously by a single patterning process, and the pixel electrode and the corresponding source electrode are positioned at a same side of the connection electrode.

2. The array substrate according to claim 1, wherein the source electrode and the pixel electrode do not overlap in a direction perpendicular to the array substrate.

3. The array substrate according to claim 1, wherein each of the one or more transistors further comprises a drain electrode, wherein a material for forming the drain electrode and the source electrode comprises Cu.

4. The array substrate according to claim 1, wherein a material for forming the connection electrode includes indium tin oxide.

5. A display device, comprising the array substrate according to claim 1.

6. The array substrate according to claim 1, further comprising a substrate on which the plurality of pixels and the one or more transistors are positioned, wherein the connection electrode is between the source electrode and the substrate.

7. The array substrate according to claim 1, further comprising a substrate on which the plurality of pixels and the one or more transistors are positioned, wherein each of the one or more transistors comprises a gate insulating layer and a gate between the substrate and the gate insulating layer.

8. The array substrate according to claim 7, wherein each of the one or more transistors comprises an active layer, the gate insulating layer is between the gate and the active layer.

9. The array substrate according to claim 1, wherein each of the plurality of pixels comprises a common connection electrode, the common electrode of each of the plurality of pixels is electrically connected to the common electrode of an adjacent pixel of the plurality of pixels by the common connection electrode.

10. The array substrate according to claim 9, wherein each of the plurality of pixels comprises a common electrode line, the common electrode is electrically connected to the common connection electrode by the common electrode line.

* * * * *